US012071687B2

(12) United States Patent
Nakaya et al.

(10) Patent No.: US 12,071,687 B2
(45) Date of Patent: Aug. 27, 2024

(54) PLASMA PROCESSING METHOD AND PLASMA PROCESSING APPARATUS

(71) Applicant: Tokyo Electron Limited, Tokyo (JP)

(72) Inventors: Michiko Nakaya, Miyagi (JP); Toru Hisamatsu, Miyagi (JP); Shinya Ishikawa, Miyagi (JP); Sho Kumakura, Miyagi (JP); Masanobu Honda, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 184 days.

(21) Appl. No.: 17/900,577

(22) Filed: Aug. 31, 2022

(65) Prior Publication Data

US 2022/0411928 A1    Dec. 29, 2022

Related U.S. Application Data

(63) Continuation of application No. 16/522,890, filed on Jul. 26, 2019, now Pat. No. 11,459,655.

(30) Foreign Application Priority Data

Jul. 26, 2018  (JP) .................................. 2018-140334
Jun. 3, 2019   (JP) .................................. 2019-104041

(51) Int. Cl.
*C23C 16/455*    (2006.01)
*C23C 16/52*     (2006.01)
(Continued)

(52) U.S. Cl.
CPC .. *C23C 16/45536* (2013.01); *C23C 16/45544* (2013.01); *C23C 16/45553* (2013.01);
(Continued)

(58) Field of Classification Search
CPC ........ C23C 16/45544; C23C 16/45536; C23C 16/04; H01L 21/02304; H01L 21/31144; H01L 21/0337; H01L 21/0228
See application file for complete search history.

(56) References Cited

U.S. PATENT DOCUMENTS

2005/0051865 A1   3/2005  Lee et al.
2005/0136684 A1   6/2005  Mukai et al.
(Continued)

FOREIGN PATENT DOCUMENTS

JP   2006-173299 A   6/2006
JP   2017-174919 A   9/2017
(Continued)

OTHER PUBLICATIONS

Woo-Hee Kim, et al. "A Process for Topographically Selective Deposition on 3D Nanostructures by Ion Implantation ACS Nano 2016, 10, 4451-4458".

*Primary Examiner* — Joseph A Miller, Jr.
(74) *Attorney, Agent, or Firm* — XSENSUS LLP

(57) ABSTRACT

A plasma processing apparatus in the present disclosure includes a plasma processing chamber, a gas supply, a power supply, and a controller. The controller causes (a) forming a first film on side walls of an opening of a processing target using the plasma so that the first film has different thicknesses along a spacing between pairs of side walls facing each other, and (b) forming a second film by performing a film forming cycle one or more times after (a) so that the second film has different thicknesses along the spacing between the pairs of side walls facing each other.

17 Claims, 12 Drawing Sheets

(51) Int. Cl.
*H01J 37/32* (2006.01)
*H01L 21/02* (2006.01)
*H01L 21/311* (2006.01)

(52) U.S. Cl.
CPC ........ *C23C 16/52* (2013.01); *H01J 37/32834* (2013.01); *H01L 21/0228* (2013.01); *H01L 21/31116* (2013.01); *H01L 21/31144* (2013.01); *H01J 2237/3321* (2013.01); *H01J 2237/3341* (2013.01)

(56) References Cited

U.S. PATENT DOCUMENTS

| | | | |
|---|---|---|---|
| 2008/0008969 A1* | 1/2008 | Zhou | H01L 23/564 |
| | | | 430/311 |
| 2009/0162989 A1 | 6/2009 | Cho et al. | |
| 2014/0138790 A1 | 5/2014 | Sugino et al. | |
| 2017/0140983 A1 | 5/2017 | Leschkies et al. | |
| 2017/0148642 A1 | 5/2017 | Wang et al. | |

FOREIGN PATENT DOCUMENTS

| | | |
|---|---|---|
| TW | 200525689 A | 8/2005 |
| TW | 200531206 A | 9/2005 |

\* cited by examiner

PRECURSOR GAS
(SILICON-CONTAINING GAS)

OXYGEN ATOM

O1  O2  O3  O4  O5  O6  O7

X<Y shrink

X>Y shrink

| COMBINATION | A | B | C |
|---|---|---|---|
| MASK | SiO2 | SiN | TiN/WC/ZrO2 |
| ETCHED LAYER | SiN/Si/SiGe | SiO2 | SiO2 |
| ALD FILM (SECOND FILM) | SiO2 | SiN | TiN/WC |

PLASMA PROCESSING METHOD AND PLASMA PROCESSING APPARATUS

CROSS-REFERENCE TO RELATED APPLICATION

This application is a continuation application of U.S. patent application Ser. No. 16/522,890, filed on Jul. 26, 2019, which claims priority from Japanese Patent Application No. 2018-140334, filed on Jul. 26, 2018, and Japanese Patent Application No. 2019-104041, filed on Jun. 3, 2019, respectively, all of which are incorporated herein in their entirety by reference and priority is claimed to each.

TECHNICAL FIELD

The following disclosure relates to a plasma processing method and a plasma processing apparatus.

BACKGROUND

A plasma-enhanced atomic layer deposition (PE-ALD) method is known as a kind of method for forming a film on a substrate. Various techniques, including the PE-ALD method, are used to form a pattern in the semiconductor devices.

For example, there has been proposed a method using ALD such that film formation is selectively promoted according to the position of an opening formed in a substrate (US Patent Laid-Open Publication No. 2017/0140983). In addition, there has been proposed a method of selectively forming a self-assembled monolayer (SAM) and then performing gas phase etching (US Patent Laid-Open Publication No. 2017/0148642). Furthermore, there has been proposed a method for implementing selective film formation on a 3D nanostructure using ion implantation (Woo-Hee Kim, et al., "A Process for Topographically Selective Deposition on 3D Nanostructures by Ion Implantation" ACS Nano 2016, 10, 4451-4458).

SUMMARY

A plasma processing method performed by a plasma processing apparatus according to an aspect of the present disclosure includes a first step and a second step. In the first step, the plasma processing apparatus forms a first film on the side walls of an opening in a processing target, in which the first film has different thicknesses along a spacing between pairs of side walls facing each other. In the second step after the first step, the plasma processing apparatus performs a film forming cycle once or more times to form a second film having different thicknesses along the spacing between the pairs of side walls facing each other.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Hereinafter, embodiments disclosed herein will be described in detail based on the accompanying drawings. Here, the embodiments are not limited. In addition, respective embodiments may be appropriately combined within a range not inconsistent with processing contents.

<Incubation Mechanism in ALD>

Before describing the embodiments, incubation mechanism in ALD will be described.

Figure 2A:
FIG. 2A is a view for explaining a chemisorption step of a precursor gas in ALD.
Figure 2B:
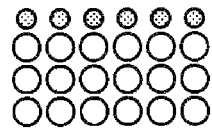
FIG. 2B is a view for explaining a purge step of the precursor gas in the ALD.
Figure 2C:
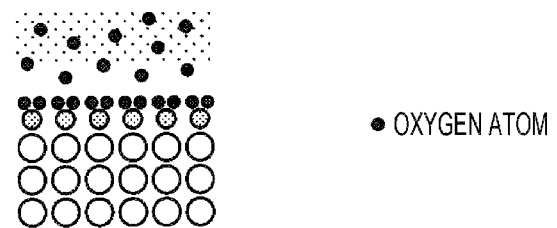
FIG. 2C is a view for explaining a step of activating with a reaction gas in the ALD.
Figure 2D:
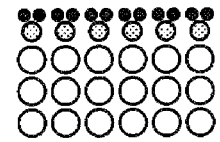
FIG. 2D is a view for explaining a purge step of the reaction gas in the ALD.

FIGS. 2A to 2D are views for explaining an example of a flow of general ALD. FIG. 2A is a view for explaining a chemisorption step of a precursor gas in the ALD. FIG. 2B is a view for explaining a purge step of the precursor gas in the ALD. FIG. 2C is a view for explaining a step of activating with a reaction gas in the ALD. FIG. 2D is a view for explaining a purge step of the reaction gas in the ALD. As illustrated in FIGS. 2A to 2D, the ALD generally includes the following four steps.

(1) A chemisorption step of exposing a processing target (e.g., a semiconductor substrate) disposed in a processing chamber to a precursor gas (see FIG. 2A)

(2) A purge step of purging the precursor gas remaining in the processing chamber (see FIG. 2B)

(3) A reaction step of exposing the processing target disposed in the processing chamber to a reaction gas (see FIG. 2C)

(4) A purge step of purging the reaction gas remaining in the processing chamber (see FIG. 2D)

In the following description, it is assumed that reaction step (3) is performed by forming the reaction gas into plasma. In the ALD, steps (1) to (4) are repeated to form a film on the processing target. Here, purge steps (2) and (4) are optional steps, and may not necessarily be performed.

In the ALD, an $SiO_2$ film may be deposited on a processing target using, for example, a silicon-containing gas as a precursor gas, and using an O-containing gas as a reaction gas. In this case, first, in step (1), the processing target disposed in the processing chamber is exposed to a silicon-containing gas which is a precursor gas. Then, the silicon-containing gas is chemisorbed onto the surface of the processing target. The precursor gas remaining in the processing chamber without being chemisorbed to the processing target is purged in step (2). Thereafter, in step (3), the O-containing gas is formed into plasma, and oxygen radicals react with the silicon-containing molecules chemisorbed to the processing target (oxidize silicon) to form an $SiO_2$ film one layer. The O-containing gas remaining in the processing chamber is purged in step (4). Since the ALD basically forms the film one layer at a time and stops the processing when there is no surface to which atoms are chemisorbed on the processing target, it is possible to form a conformal film in a self-controllable manner.

When a factor that inhibits the chemisorption of the precursor gas (hereinafter also referred to as an "inhibitor") is present on the surface of the processing target, the precursor gas is not chemisorbed to the processing target in step (1), and film formation by the ALD is not performed. The delay in film formation initiation caused by such an inhibitor factor is called incubation. FIGS. 3A to 3F are views (1) to (6) for explaining incubation in a plasma processing method according to an embodiment.

Figure 3A:
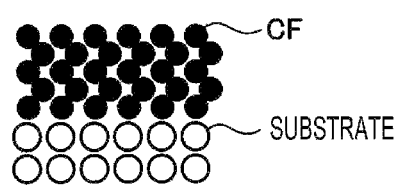
FIG. 3A is a view (1) for explaining incubation in a plasma processing method according to an embodiment.

FIG. 3A illustrates the state in which a CF film is formed on the surface of the processing target through chemical vapor deposition (CVD) using fluorocarbon (CF). In FIG. 3A, fluorine atoms (CF: fluorine atoms covalently bonded to carbons) are indicated by black circles. In addition, atoms of the processing target (substrate) are indicated by white circles.

Figure 3B:
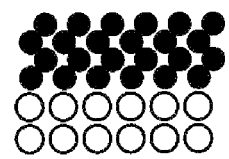
FIG. 3B is a view (2) for explaining incubation in a plasma processing method according to an embodiment.

FIG. 3B illustrates an example of the state in which an ALD cycle has been performed once on the processing target illustrated in FIG. 3A). Since a CF film serving as an inhibitor is present on the surface to the processing target, the precursor gas (a silicon-containing gas) is not chemisorbed, and film formation by ALD is not performed. On the contrary, the CF film is gradually removed from the surface of the processing target under the influence of oxygen radicals generated by oxygen plasma in the ALD cycle.

Figure 3C:
FIG. 3C is a view (3) for explaining incubation in a plasma processing method according to an embodiment.

FIG. 3C illustrates an example of the state in which the ALD cycle has been performed five times on the processing target illustrated in FIG. 3A. In the example of FIG. 3C, the film has been completely removed by the five ALD cycles.

Figure 3D:
FIG. 3D is a view (4) for explaining incubation in a plasma processing method according to an embodiment.
Figure 3E:
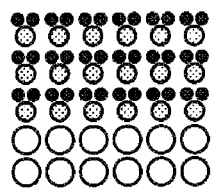
FIG. 3E is a view (5) for explaining incubation in a plasma processing method according to an embodiment.
Figure 3F:
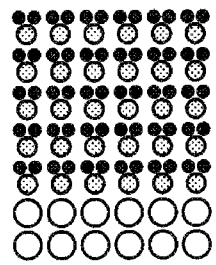
FIG. 3F is a view (6) for explaining incubation in a plasma processing method according to an embodiment.

FIGS. 3D, 3E, and 3F respectively illustrate examples of the states in which the ALD cycle is performed six times, eight times, and ten times on the processing target illustrated in FIG. 3A. As illustrated in FIG. 3C, by performing the ALD cycle five times, the CF film is removed, and the layer under the CF film is exposed. Since a substance to which the precursor gas is capable of being chemisorbed is present on the surface of the processing target in this state, the precursor gas is chemisorbed and reacts with the reaction gas to start film formation as illustrated in FIG. 3D. Thereafter, as illustrated in FIGS. 3E and 3F, the film thickness increases each time when the ALD cycle is performed. In FIGS. 3D, 3E and 3F, the circles in the second layer from the top indicate the Si-containing precursor gas, and the circles on the top indicate oxygen atoms.

<Control of X-Y Pattern>

Various patterns are formed on a substrate when manufacturing semiconductor devices. For example, a plurality of openings having similar shapes may be formed in one substrate. In such a case, a precise control of the dimensions of the openings affects the performance of the semiconductor devices.

Figure 4A:
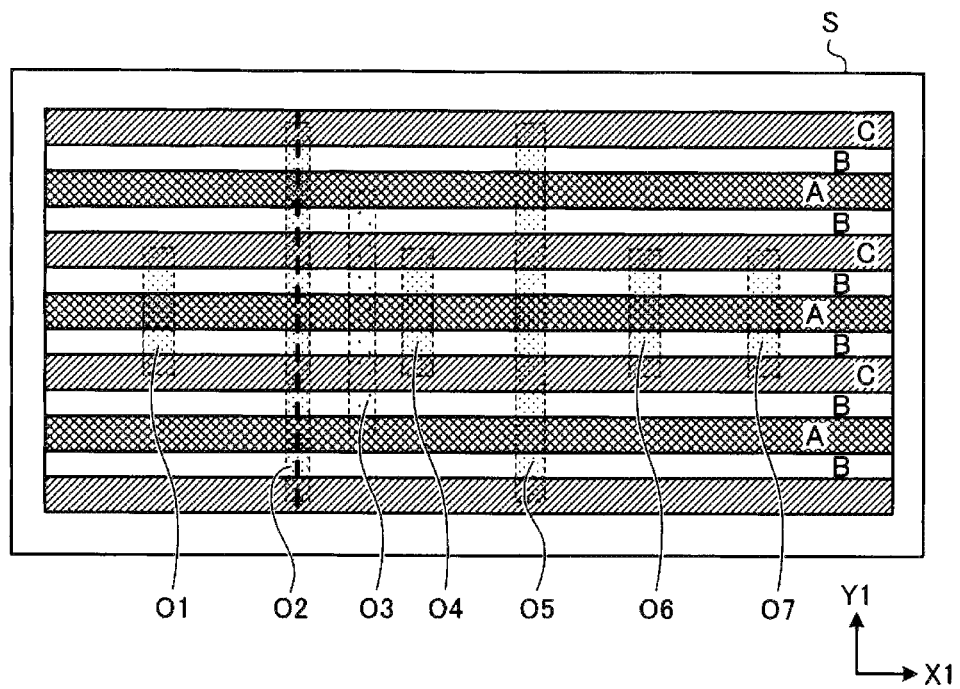
FIG. 4A is a view for explaining a dimension control of openings formed in a mask.
Figure 4B:
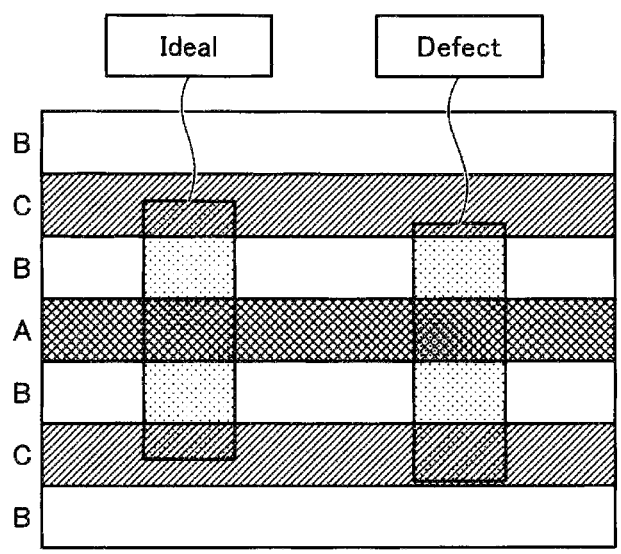
FIG. 4B is a view for explaining an example of openings formed in a mask.
Figure 4C:
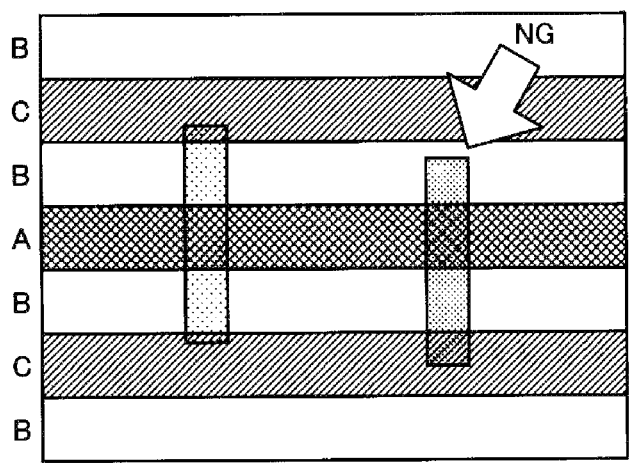
FIG. 4C is a view illustrating an exemplary pattern formed when etching is performed using the mask of FIG. 4B.

FIG. 4A is a view for explaining a dimension control of openings formed in a mask. A substrate S illustrated in FIG. 4A is formed by self-aligned double patterning. Therefore, on the surface of the substrate S, lines formed of different types of a material A (core), a material B (spacer), and a material C (fill) are arranged in the order of A, B, C, B, A, B, C, B, and A. Hereinafter, a line formed of the material A is referred to as a line A, a line formed of the material B is referred to as a line B, and a line formed of the material C is referred to as a line C. Here, it is considered that the etching of the substrate S is performed using a mask having a shape indicated by dotted lines in FIG. 4A. In FIG. 4A, openings O1, O2, O4, O5, O6, and O7, each having two ends located on separate lines C, respectively, and an opening O3 having two ends formed to be located on separate lines A, respectively. For the convenience of description, the longitudinal direction of the lines illustrated in FIGS. 4A to 4C is referred to as an X1 direction, and the direction crossing the lines is referred to as a Y1 direction.

When a mask having the shape illustrated in FIG. 4A can be formed, there is no big problem in the shape of the pattern formed by etching thereafter. However, as illustrated in FIG. 4B, it is assumed that openings in the mask are formed at positions deviated from desired positions in the Y1 direction. FIG. 4B is a view for explaining an example of openings formed in a mask. In this case, when etching of the substrate S is performed using the mask, as illustrated in FIG. 4C, the positions of the openings formed on the substrate S are further deviated in the Y1 direction and the openings may not be formed to connect the lines C. FIG. 4C is a view illustrating an exemplary pattern formed when etching is performed using the mask of FIG. 4B. When a mask as illustrated in FIG. 4B is formed, it is convenient if the dimensions of the openings of the mask once formed are adjustable in order to prevent the occurrence of a defect as illustrated in FIG. 4C. In particular, in the case of a mask having the shape illustrated in FIG. 4A, the dimension control in the long side direction of the openings rather than the dimension control in the short side direction of the openings affects the subsequent wiring formation. Substantially rectangular openings having a short side and a long side in top view as described above may be referred to as an X-Y pattern.

Figure 5A:
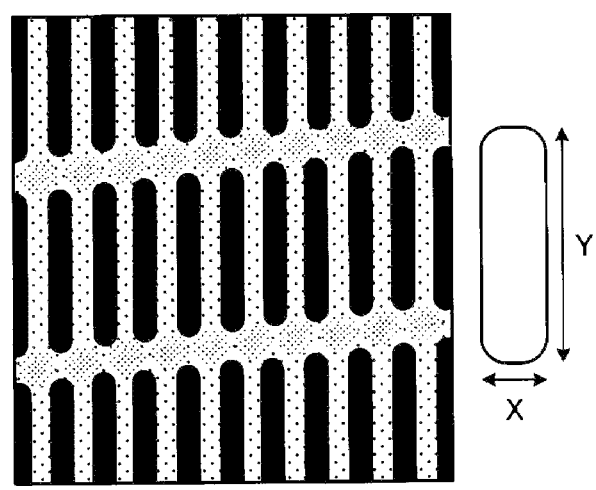
FIG. 5A is a view for explaining an X-Y pattern.

FIG. 5A is a view for explaining an X-Y pattern. FIG. 5A is a partial top view of an X-Y pattern formed on a substrate. In the substrate illustrated in FIG. 5A, a plurality of substantially rectangular openings are formed in the state of being aligned in top view. The plurality of openings have substantially the same dimensions. The X-Y pattern may have not only a substantially rectangular shape in top view, but also a substantially elliptical shape in top view. The X-Y pattern refers to a pattern having a difference in dimension in two directions (X direction and Y direction) orthogonal to each other in top view.

Figure 5B:
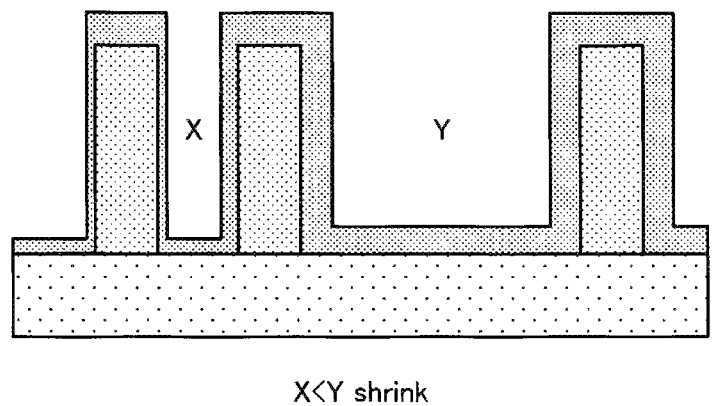
FIG. 5B is a view for explaining Dimension Control Example 1 of an X-Y pattern.
Figure 5C:
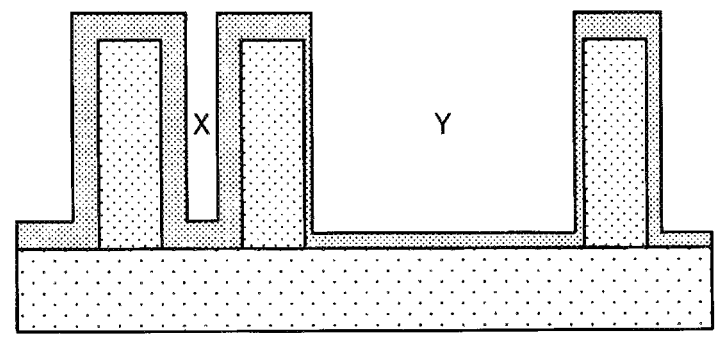
FIG. 5C is a view for explaining Dimension Control Example 2 of an X-Y pattern.

FIG. 5B is a view for explaining Dimension Control Example 1 of an X-Y pattern. FIG. 5C is a view for explaining Dimension Control Example 2 of an X-Y pattern. The example of FIG. 5B is a control example that reduces the opening dimension of the long side Y while maintaining the opening dimension of the short side X (X<Y shrink: the opening is reduced such that the reduction amount of the Y side is larger than that of the X side). In the example of FIG. 5B, after the X-Y pattern is formed, the film is formed on the substrate such that the Y side is reduced. Meanwhile, the example of FIG. 5C is a control example that reduces the opening dimension of the short side X while maintaining the opening dimension of the long side Y (X>Y shrink: the opening is reduced such that the reduction amount of the X side is larger than that of the Y side). In the example of FIG. 5C, after the X-Y pattern is formed, the film is formed on the substrate such that the X side is reduced.

In order to prevent the occurrence of a defect as illustrated in FIG. 4C, it is believed that it would be better if the reduction amount of the Y side of the opening is made as small as possible by executing the X>Y shrink of the opening in the mask of FIG. 4B (FIG. 5C).

Embodiment

In view of the above, in the plasma processing apparatus according to the present embodiment, after the first film having a film thickness difference corresponding to the state of the pattern formed on the substrate is formed through CVD, a second film is formed by performing an ALD cycle using a material for which the first film functions as an inhibitor. The plasma processing apparatus forms the first film having a film thickness difference through CVD using, for example, a loading effect. Thereafter, when the ALD cycle is performed, the first film is gradually scraped by the influence of plasma, but an incubation time corresponding to the film thickness of the first film occurs. Therefore, for example, the second film is thinly formed at the position where the first film is thickly formed, and the second film is thickly formed at the position where the first film is thinly formed. As described above, the plasma processing apparatus according to the present exemplary embodiment implements a precise dimensional control using the incubation and loading effects.

Example of Plasma Processing Apparatus According to Embodiment

Figure 1:
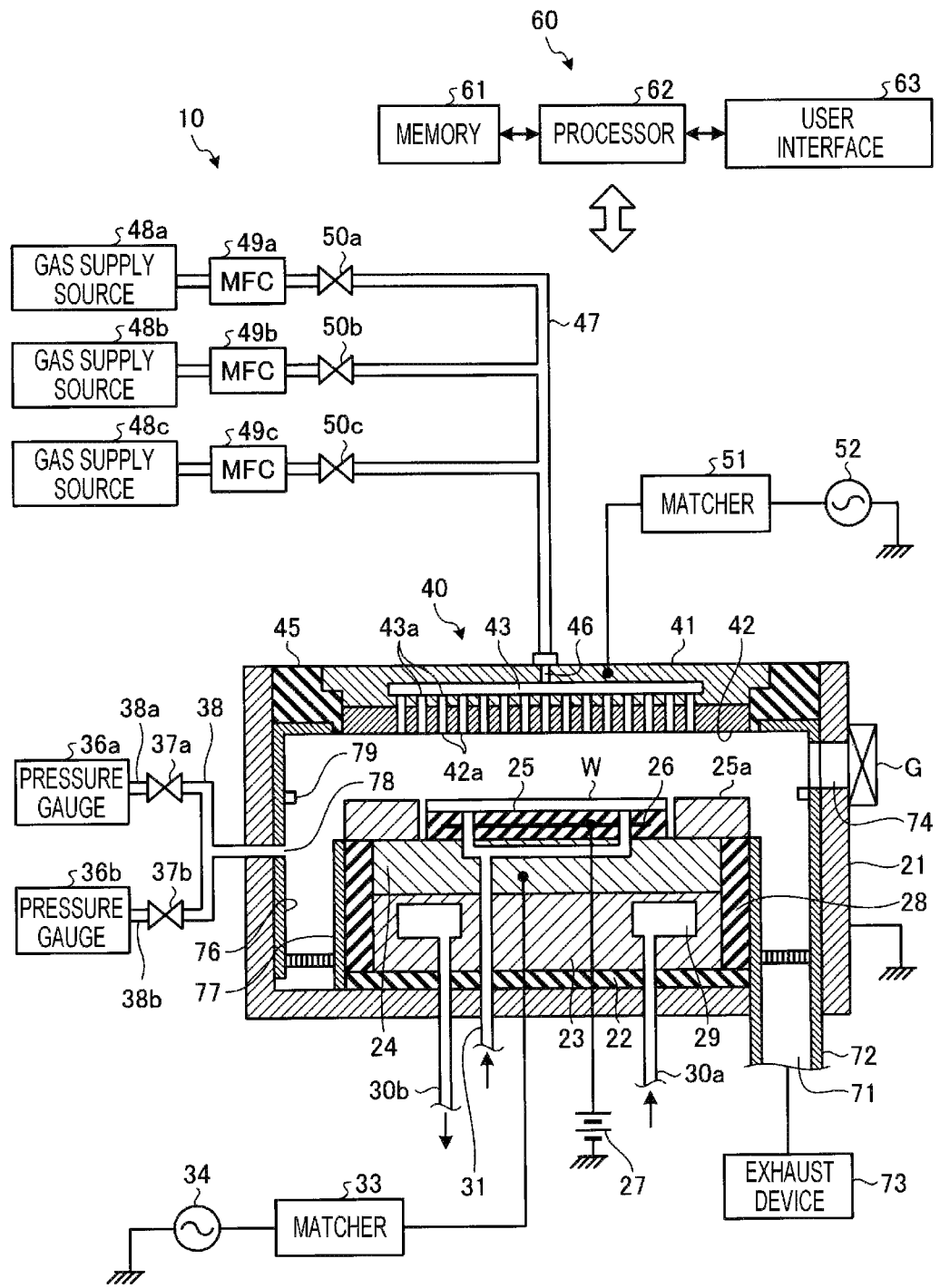
FIG. 1 is a view illustrating an exemplary configuration of a plasma processing apparatus according to an embodiment.

FIG. 1 is a view illustrating an exemplary configuration of a plasma processing apparatus 10 according to an embodiment. For example, as illustrated in FIG. 1, the plasma processing apparatus 10 in the present embodiment includes a chamber 21 which is formed of, for example, aluminum having an anodized surface and defines a substantially cylindrical processing space therein. The chamber 21 is grounded for safety. The plasma processing apparatus 10 in the present embodiment is configured as, for example, a capacitively coupled parallel plate plasma processing apparatus. In the chamber 21, a support 23 is disposed through an insulating plate 22 formed of, for example, ceramic. A susceptor 24 made of, for example, aluminum and configured to function as a lower electrode is provided on the support 23.

An electrostatic chuck 25 configured to attract and hold a semiconductor wafer W, which is an example of the processing target, by an electrostatic force is provided at the substantially upper center of the susceptor 24. The electrostatic chuck 25 has a structure in which an electrode 26 formed of, for example, a conductive film, is sandwiched between a pair of insulating layers. A DC power supply 27 is electrically connected to the electrode 26. In addition, the electrostatic chuck 25 may be provided with a heater (not illustrated) for heating the semiconductor wafer W.

A focus ring 25a is disposed on the susceptor 24 to surround the electrostatic chuck 25. The uniformity of the plasma in the vicinity of the edge of the semiconductor wafer W is improved by the focus ring 25a. The focus ring 25a is formed of, for example, single crystal silicon. An inner wall member 28 is provided around the support 23 and the susceptor 24 to surround the support 23 and the susceptor 24. The inner wall member 28 is formed, for example, of quartz in a substantially cylindrical shape.

Inside the support 23, for example, a coolant chamber 29 is formed in the circumferential direction of the support 23. A coolant having a predetermined temperature is circulated and supplied to the coolant chamber 29 from a chiller unit (not illustrated) provided outside through a pipe 30a and a pipe 30b. By circulating the coolant at a predetermined temperature in the coolant chamber 29, it is possible to control the semiconductor wafer W on the electrostatic chuck 25 to a predetermined temperature by heat exchange with the coolant. In addition, a heat transfer gas supplied from the gas supply mechanism (not illustrated) is supplied between the upper surface of the electrostatic chuck 25 and the rear surface of the semiconductor wafer W mounted on the electrostatic chuck 25 through the pipe 31. The heat transfer gas is, for example, helium gas.

An upper electrode 40 is provided above the susceptor 24 functioning as the lower electrode to face the susceptor 24 via the processing space in the chamber 21. A space located between the upper electrode 40 and the susceptor 24 and surrounded by the chamber 21 is a processing space in which plasma is generated. The upper electrode 40 has a top plate 42 configured to function as an electrode main body, and a top plate support 41 configured to support the top plate 42.

The top plate support 41 is supported on the upper portion of the chamber 21 through the insulating member 45. The top plate support 41 is formed in a substantially disk shape, for example, of a conductive material having a relatively high thermal conductivity, such as, for example, aluminum having an anodized surface. Moreover, the top plate support 41 also functions as a cooling plate that cools the top plate 42 heated by the plasma generated in the processing space. A gas inlet port 46 through which a processing gas is introduced, a diffusion chamber 43 in which the processing gas introduced from the gas inlet 46 is diffused, and a plurality of flow ports 43a serving as flow paths through which the processing gas diffused in the diffusion chamber 43 flows downward are formed in the top plate support 41.

The top plate 42 is formed in a substantially disk shape, for example, by a silicon-containing material such as quartz. The top plate 42 has a plurality of gas inlet ports 42a penetrating the top plate 42 in the thickness direction of the top plate 42. Each gas inlet port 42a is disposed to communicate with any one of the flow ports 43a of the top plate support 41. Thus, the processing gas supplied into the diffusion chamber 43 is diffused and supplied in a shower shape into the chamber 21 through the flow ports 43a and the gas inlet ports 42a.

A plurality of valves 50a to 50c are connected to the gas inlet port 46 of the top plate support 41 through a pipe 47. A gas supply source 48a is connected to the valve 50a via a mass flow controller (MFC) 49a. When the valve 50a is controlled to be open, that is, to be in the open state, the flow rate of the processing gas supplied from the gas supply source 48a is controlled by the MFC 49a, and is supplied into the chamber 21 through the pipe 47. The gas supply source 48a supplies, for example, a precursor gas into the chamber 21.

In addition, a gas supply source 48b is connected to the valve 50b via an MFC 49b. When the valve 50b is controlled to be open, the flow rate of the processing gas supplied from the gas supply source 48b is controlled by the MFC 49b, and is supplied into the chamber 21 through the pipe 47. The gas supply source 48b supplies, for example, a purge gas into the chamber 21. As the purge gas, for example, an inert gas such as, for example, argon gas or nitrogen gas, is used.

In addition, a gas supply source 48c is connected to the valve 50c via an MFC 49c. When the valve 50c is controlled to be open, the flow rate of the processing gas supplied from the gas supply source 48c is controlled by the MFC 49c, and is supplied into the chamber 21 through the pipe 47. The gas supply source 48c supplies, for example, a reaction gas into the chamber 21.

In addition, in supplying the precursor gas and the reaction gas to the chamber 21, an additive gas may be used for the purpose of productivity such as, for example, reduction of amounts of precursor gas and reaction gas used and uniformization of gas distribution inside the chamber 21. As the additive gas, for example, an inert gas such as, for example, argon gas or nitrogen gas may be used. For example, an inert gas supplied from the gas supply source 48b via the valve 50b and the MFC 49b may be added to the precursor gas supplied from the gas supply source 48a via the valve 50a and the MFC 49a. In addition, for example, an inert gas supplied from the gas supply source 48b via the valve 50b and the MFC 49b may be added to the reaction gas supplied from the gas supply source 48c via the valve 50c and the MFC 49c.

Adjustment of the flow rates of respective gases by the respective MFCs 49a to 49c and opening/closing of the respective valves 50a to 50c are controlled by a control device 60 described later.

A radio-frequency power supply 52 is electrically connected to the upper electrode 40 via a matcher 51. The radio-frequency power supply 52 supplies, for example, radio-frequency power (high frequency (HF)) of about 40 MHz for plasma excitation to the upper electrode 40. The radio-frequency power supplied from the radio-frequency power supply 52 is controlled by the control device 60 described later.

A radio-frequency power supply 34 is electrically connected to the susceptor 24 functioning as the electrode via a matcher 33. The radio-frequency power supply 34 applies radio-frequency power (low frequency (LF)) for bias to the susceptor 24. The radio-frequency power supply 34 supplies radio-frequency power of 13.56 MHz or less (e.g., 2 MHz) to the susceptor 24 via the matcher 33. By supplying the radio-frequency power to the susceptor 24, active species such as ions in plasma are drawn into the semiconductor wafer W on the electrostatic chuck 25. The radio-frequency power supplied from the radio-frequency power supply 34 is controlled by the control device 60 described later.

An opening 78 is formed in the side wall of the chamber 21, and a pipe 38 is connected to the opening 78. The pipe 38 is branched into two, one side of which is connected to one end of the valve 37a and the other side of which is connected to one end of the valve 37b. The other end of the valve 37a is connected to a pressure gauge 36a via a pipe 38a, and the other end of the valve 37b is connected to a pressure gauge 36b via a pipe 38b. The pressure gauges 36a, 36b are, for example, capacitance manometers.

When the valve 37a is controlled to be open, the pipe 38 and the pipe 38a communicate with each other. Therefore, the pressure gauge 36a is exposed to the processing space in the chamber 21 through the opening 78 formed in the side wall of the chamber 21. Accordingly, the pressure gauge 36a is capable of measuring the pressure in the processing space. Meanwhile, when the valve 37a is controlled to be closed, that is, to be in the closed state, the pipe 38 and the pipe 38a are shut off. Thus, the pressure gauge 36a is shielded from the processing space in the chamber 21.

In addition, when the valve 37b is controlled to be open, the pipe 38 and the pipe 38b communicate with each other. Therefore, the pressure gauge 36b is exposed to the processing space in the chamber 21 through the opening 78 formed in the side wall of the chamber 21. Accordingly, the pressure gauge 36b is capable of measuring the pressure in the processing space. Meanwhile, when the valve 37b is controlled to be closed, the pipe 38 and the pipe 38b are shut off. Thus, the pressure gauge 36b is shielded from the processing space in the chamber 21. The opening/closing control of the valves 37a and 37b is performed by the control device 60 described later.

An exhaust port 71 is provided in the bottom portion of the processing container 21, and an exhaust apparatus 73 is connected to the exhaust port 71 through an exhaust pipe 72. The exhaust apparatus 73 includes, for example, a vacuum pump such as a dry pump (DP) or a turbo molecular pump (TMP), and is capable of reducing the pressure in the chamber 21 to a desired degree of vacuum. For example, the displacement of the exhaust apparatus 73 is controlled by the control device 60 described later. For example, when the precursor gas is supplied into the chamber 21 from the gas supply source 48a, the control device 60 controls the valve 37a to be in the open state and controls the valve 37b to be in the closed state. Then, the pressure in the chamber 21 is controlled to a predetermined pressure by controlling, for example, the displacement of the exhaust apparatus 73 based on the pressure in the chamber 21 measured by the pressure gauge 36a. In addition, for example, when the reaction gas is supplied into the chamber 21 from the gas supply source 48c, the control device 60 controls the valve 37a to be in the closed state and controls the valve 37b to be in the open state. Then, the pressure in the chamber 21 is controlled to a predetermined pressure by controlling, for example, the displacement of the exhaust apparatus 73 based on the pressure in the chamber 21 measured by the pressure gauge 36b.

An opening 74 for carrying in and out a semiconductor wafer W is provided in the side wall of the chamber 21. The opening 74 is configured to be capable of being opened/closed by a gate valve G. In addition, on the inner wall of the chamber 21, a deposit shield 76 is detachably provided along the wall surface. Furthermore, on the outer peripheral surface of the inner wall member 28, a deposit shield 77 is detachably provided along the outer peripheral surface of the inner wall member 28. The deposit shields 76 and 77 prevent the deposition of a reaction byproduct (deposit) on the inner wall of the chamber 21 and the inner wall member 28. A conductive member (GND block) 79 connected to the ground is provided at the position of the deposit shield 76 having substantially the same height as the semiconductor wafer W mounted on the electrostatic chuck 25. The GND block 79 prevents abnormal discharge in the chamber 21.

The operations of the plasma processing apparatus 10 described above are totally controlled by the control unit 60. The control device 60 includes, for example, memory 61 such as, for example, read only memory (ROM) or random access memory (RAM), a processor 62 such as a central processing unit (CPU) or a digital signal processor (DSP), and a user interface 63. The user interface 63 includes, for example, a keyboard on which a user such as, for example, a process manager performs an input operation of input commands for managing the plasma processing apparatus 10, and a display configured to visualize and display an operation situation of the plasma processing apparatus 10.

The memory 61 stores a control program (software), or a recipe including, for example, processing condition data for implementing various processings in the plasma processing apparatus 10. Then, the processor 62 controls each unit of the plasma processing apparatus 10 by calling and executing an arbitrary recipe from the memory 61 in response to an instruction from the user via the user interface 63. As a result, a desired processing such as, for example, film formation is performed by the plasma processing apparatus 10. In addition, as the recipe and control program including, for example, processing condition data, it is possible to use those stored in, for example, a computer-readable recording medium, or those transmitted from another device, for example, via a communication line. The computer-readable recording medium is, for example, a hard disk, a compact disk (CD), a digital versatile disk (DVD), a flexible disk, or a semiconductor memory.

Although a plasma processing apparatus 10 using capacitively coupled plasma (CCP) is described here as a plasma source as an example, the technique disclosed herein is not limited thereto, and a plasma processing apparatus 10 using an arbitrary plasma source such as, for example, an inductively coupled plasma (ICP) or microwave plasma, may be adopted.

Example of Flow of Plasma Processing Method According to Embodiment

Figure 6:
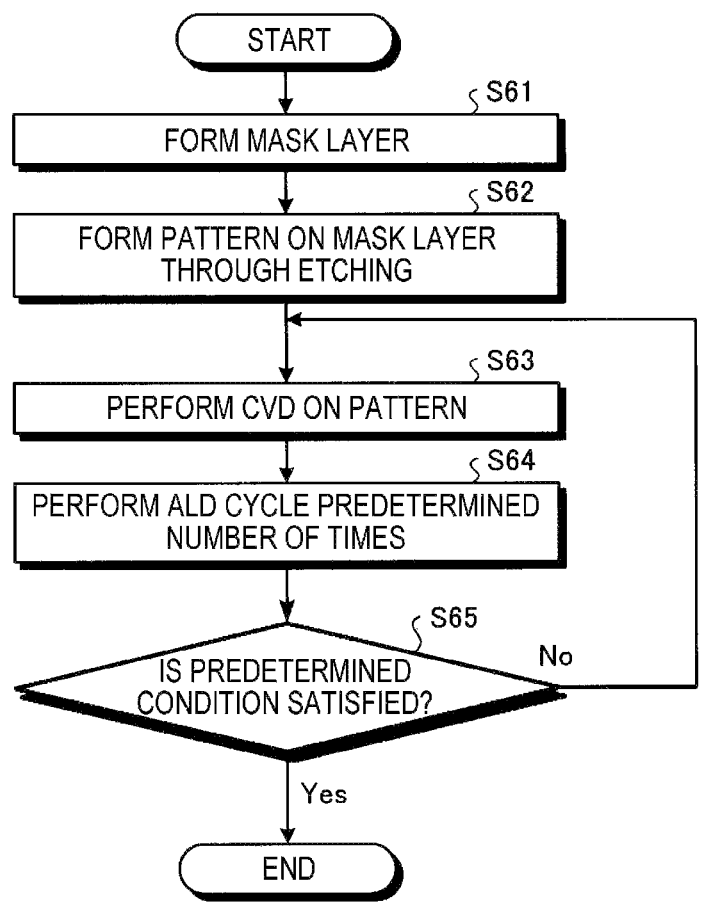
FIG. 6 is a flowchart illustrating an exemplary rough flow of a plasma processing method in a plasma processing apparatus according to an embodiment.

FIG. 6 is a flowchart illustrating an exemplary rough flow of a plasma processing method in the plasma processing apparatus 10 according to the embodiment.

First, a processing target (e.g., a wafer W) is placed in the chamber 21 of the plasma processing apparatus 10. The plasma processing apparatus 10 first forms a mask layer on the surface of a processing target (step S61). Next, the plasma processing apparatus 10 forms a pattern on the mask layer by etching (step S62). The pattern includes, for example, an opening having the X-Y pattern. Here, steps S61 and S62 may not be performed in the plasma processing apparatus 10, but may be performed in another apparatus. For example, after the mask layer and the pattern are formed on the wafer W in another apparatus, the wafer W may be moved into the chamber 21 of the plasma processing apparatus 10 to perform the following processing.

Next, the plasma processing apparatus 10 performs CVD using a gas serving as an inhibitor by forming a film on the formed pattern (step S63, first step). By the CVD, a first film (hereinafter, also referred to as an inhibitor layer) having different thicknesses depending on the shape of the pattern on the processing target is formed. Next, the plasma processing apparatus 10 executes an ALD cycle a predetermined number of times from the top of the first film (step S64, second step). By the ALD cycle, a second film is formed on the process target. Thereafter, the plasma processing apparatus 10 determines whether a predetermined condition is satisfied (step S65). When it is determined that the predetermined condition is satisfied (step S65, Yes), the plasma processing apparatus 10 terminates the processing. On the other hand, when it is determined that the predetermined condition is not satisfied (step S65, No), the plasma processing apparatus 10 returns to step S63 and repeats the processing. This is a rough flow of the plasma processing method according to an embodiment. The plasma processing apparatus 10 may be configured to perform a separate processing after step S64. In the following description, one processing from step S63 to step S64 is also referred to as one sequence.

<Film Thickness of First Film>

The film thickness of the first film to be the inhibitor layer formed through CVD by the plasma processing apparatus 10 is determined by various factors. For example, by utilizing a loading effect, the plasma processing apparatus 10 is capable of forming the first film to a desired film thickness. The loading effect is a phenomenon in which, for example, the film thickness of the film to be formed varies depending on the compactness of the pattern. For example, the size of an opening after film formation varies depending on a pattern size itself, for example, the opening area of the opening. In addition, the size of the opening after film formation varies depending on the shape and arrangement of a pattern around the above-mentioned pattern.

Figure 7:
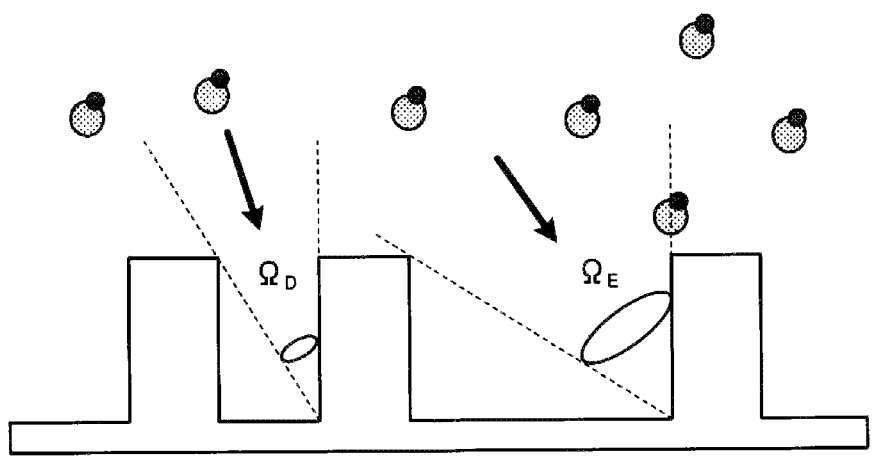
FIG. 7 is a view for explaining an exemplary loading effect.

It is considered that the loading effect occurs due to the following reason: the angle at which the film-forming material such as, for example, a gas is capable of penetrating into the opening from the opening side is determined based on the aspect ratio of the opening, and as a result, the amount of the film-forming material entering the opening is determined. FIG. 7 is a view for explaining an exemplary loading effect. As illustrated in FIG. 7, when the aspect ratio of an opening above a processing target is small, the penetration angle ($\Omega$) of the material increases. On the other hand, when the aspect ratio of the opening is large, the penetration angle of the material decreases. Therefore, the amount of film formation in each opening varies depending on the penetration angle. As a result, the deposition amount in the small X side of an opening is smaller than the deposition amount in the large Y side of the opening.

Thus, the film thickness of the first film increases as, for example, the aspect ratio of the opening decreases. In addition, for example, the film thickness of the first film becomes thicker as the solid angle of the opening is larger. In addition, for example, the film thickness of the first film fluctuates depending on the width and depth of the opening. For example, as the opening is wide and shallow, the first film becomes thick. In addition, the film thickness of the first film fluctuates depending on, for example, the compactness of the pattern formed on the processing target, and a line and space (L/S).

The material of the first film formed in the plasma processing according to the embodiment is not particularly limited as long as it is a material that inhibits the formation of the second film. For example, the first film is a hydrophobic film. In addition, for example, the first film is a film containing fluorine (F). In addition, for example, the first film is a film formed of a gas containing fluorocarbon. In addition, for example, the first film is a film formed of a gas not containing hydrogen. In addition, for example, the first film is a modified film that modifies the surface of the processing target.

<Film Thickness of Second Film>

During the formation of the second film, the first film functions as an inhibitor layer and inhibits chemisorption of the precursor gas. Therefore, the film thickness of the second film is controlled depending on the film thickness of the first film.

For example, it is assumed that the first film is thinly formed on the X side and thickly formed on the Y side due to the loading effect. In this case, when the ALD cycle is performed from the top of the first film to form the second film, the time taken for the first film on the Y side to be removed by the ALD cycle becomes longer than the time taken for the first film on the X side to be removed by the ALD cycle. Then, the timing when the formation of the second film by the ALD cycle starts on the X side becomes earlier than the timing when the formation of the second film by the ALD cycle starts on the Y side. As a result, when the same number of ALD cycles are performed on both the X side and the Y side, the film thickness of the second film formed on the X side becomes thicker than the film thickness of the second film formed on the Y side.

For example, it is assumed that the film thickness of the first film formed on the Y side is A, and the film thickness of the first film formed on the X side is B (where A>B). In addition, it is assumed that the film thickness of the first film to be removed per ALD cycle in the second step (step S64) is x, and the film thickness of the second film to be formed per ALD cycle is y. In addition, it is assumed that A=10x, and B=2x. In this case, when the ALD cycle is performed 12 times in step S64, the film thickness of the second film formed on the Y side is 2y, and the film thickness of the second film formed on the X side is 10y. However, the amount (film thickness) by which the first film formed in the first step (step S63) is removed in one ALD cycle is not equal to the film thickness of the second film formed in one ALD cycle (x≠y). Therefore, it is possible to adjust the processing conditions of the first step and the second step, for example, the processing time and the number of cycles in consideration of the removed amount of the first film and the formed amount of the second film in the second step.

Therefore, when the loading effect can be used to form an inhibitor layer of the same shape as the film formed on the substrate of FIG. 5B, it is possible to implement the X>Y shrink by the subsequent ALD cycle. In addition, when the loading effect can be used to form an inhibitor layer of the same shape as the film formed on the substrate of FIG. 5C, it is possible to implement the X<Y shrink by the subsequent ALD cycle.

Figure 8A:
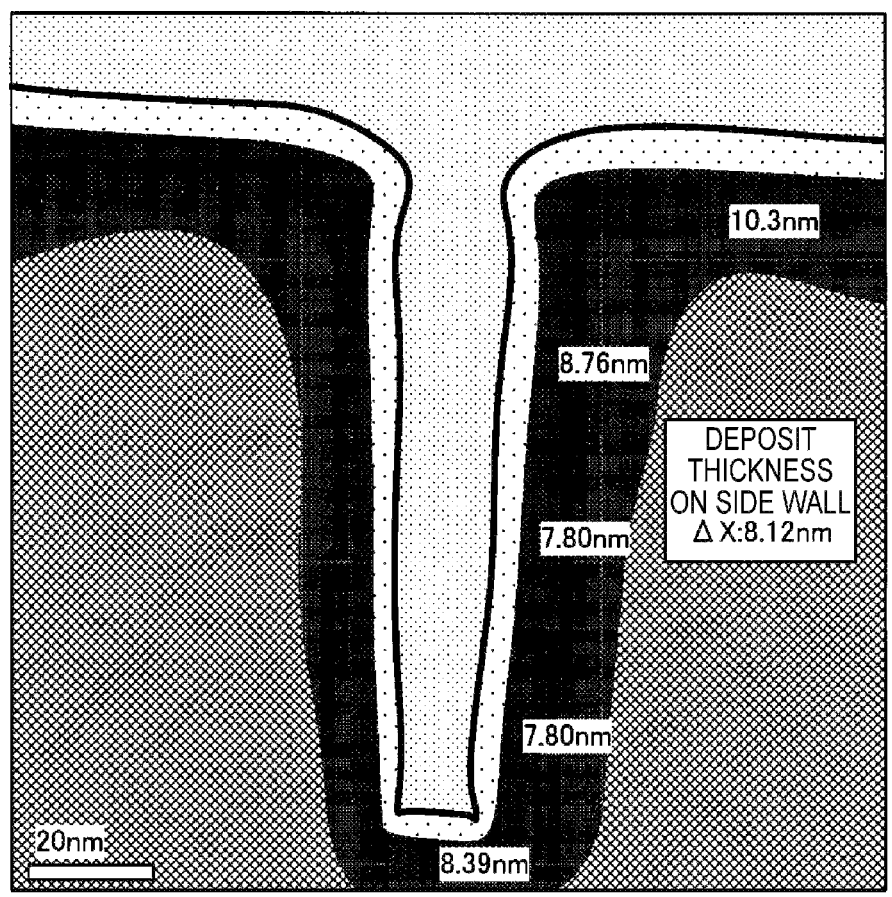
FIG. 8A is a view (1) for explaining an X>Y shrink effect obtained by a plasma processing method according to an embodiment.
Figures 8B, 9:
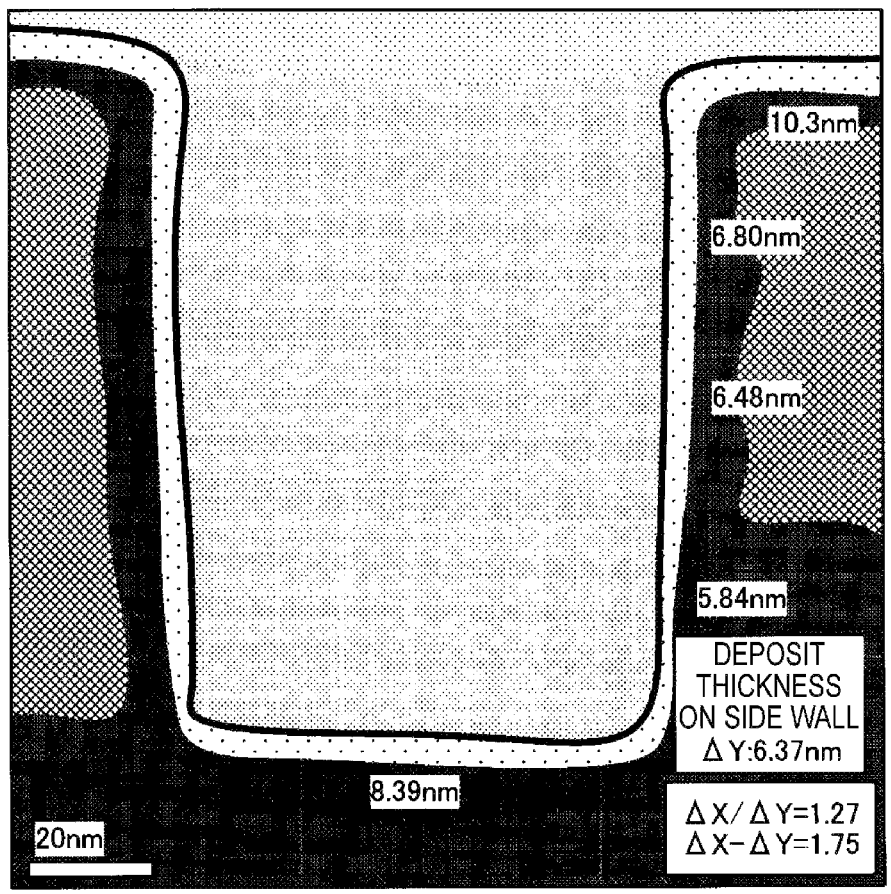
FIG. 8B is a view (2) for explaining an X>Y shrink effect obtained by a plasma processing method according to an embodiment.
FIG. 9 is a view illustrating an example of combination of materials to be processed to which a plasma processing method of an embodiment is applied.

FIGS. 8A and 8B are views for explaining an X>Y shrink effect obtained by the plasma processing method according to the embodiment. FIG. 8A schematically illustrates the state in which the second film is formed on the X side by repeating steps S63 and S64 illustrated in FIG. 6 three times. In addition, FIG. 8B schematically illustrates the state in which the second film is formed on the Y side by repeating steps S63 and S64 illustrated in FIG. 6 three times. In any case, after the CVD was performed once in step S63 to form a CF film, a predetermined number of ALD cycles were repeated in step S64, and the sequence of step S63 and step S64 was repeated three times.

As illustrated in FIG. 8A, in the X side, the length of the X side decreases by an average of 8.12 nm by the second film formed on side walls facing each other across the X side. That is, the second film of an average of 8.12 nm is formed on the side walls. On the other hand, in the Y side, the length of the Y side decreases by an average of 6.37 nm by the second film formed on side walls facing each other across the Y side. That is, the second film of an average of 6.37 nm is formed on the side walls. It can be seen from FIGS. 8A and 8B that by repeating steps S63 and S64, it is possible to reduce the opening size of both the X and Y sides while reducing the opening size of the X side more than the opening size of the Y side. That is, it can be seen that it is possible to implement the X>Y shrink. In addition, it is possible to increase the X>Y shrink effect by further increasing the number of times of performing steps S63 and S64.

Example of Other Materials of Substrate

The plasma processing method of the present embodiment is applicable to processing targets formed of various materials.

FIG. 9 is a view illustrating an example of combinations of materials of processing targets to which the plasma processing method of the present embodiment is applied. Here, it is assumed that a second film is formed by applying the plasma processing method of the present embodiment to a processing target in which a layer to be etched and a mask are sequentially formed on a substrate in order to control the dimensions of the mask. In addition, a stop layer may be formed between the layer to be etched and the substrate.

In this case, for example, a layer to be etched of silicon nitride (SiN), silicon (Si), or silicon germanium (SiGe) may be formed on a silicon substrate, and a mask of silicon dioxide ($SiO_2$) may be formed. In this case, silicon dioxide ($SiO_2$) may be used for the second film.

Further, $SiO_2$ may be used for the layer to be etched, SiN may be used for the mask, and SiN may be used for the second film. In addition, $SiO_2$ may be used for the layer to be etched and titanium nitride (TiN), and tungsten carbide (WC) or zirconium dioxide ($ZrO_2$) may be used for the mask. In this case, TiN or WC may be used for the second film.

With any combination of materials, it is possible to implement the processing using an apparatus such as, for example, CCP.

Moreover, the plasma processing method of the above-described embodiment is applicable not only to the processing target in which a layer to be etched and a mask are sequentially formed a substrate, but also to a processing target having another structure. For example, the present disclosure is applicable to a processing target in which, for example, a layer to be etched, an organic layer, and a silicon-containing antireflection layer are sequentially formed on a silicon substrate and a mask layer such as a photoresist is formed on the antireflection layer. In this case, for example, a layer formed on the substrate by multi-patterning may be interposed. Then, the pattern dimensions of the mask may be adjusted using the plasma processing method of the above-described embodiment such that the patterns formed on the mask are aligned with respective lines of the layer formed by multi-patterning. The plasma processing method of the above-described embodiment may be used in order to precisely adjust the positions where vias and contacts are formed by adjusting the pattern dimensions of the mask.

Effect of Embodiment

The plasma processing method according the above-described embodiment includes a first step and a second step. In the first step, the plasma processing apparatus forms a first film on the side walls of an opening in the processing target, in which the first film has different thicknesses along a spacing between pairs of side walls facing each other. In the second step after the first step, the plasma processing apparatus performs a film forming cycle once or more times to form a second film having different thicknesses along the spacing between the pairs of side walls facing each other. Therefore, the plasma processing apparatus is capable of forming a second film having a difference in film thickness depending on the state of a pattern on a processing target. For this reason, even if it is difficult to form a second film having a desired difference in film thickness in a single step, the plasma processing apparatus according to the embodiment is capable of forming a second film having the desired thickness in film thickness using the loading effect and incubation. For this reason, the plasma processing apparatus according to the present embodiment is capable of implementing a precise dimension control of a pattern formed on a substrate.

In the plasma processing method according to the embodiment, the plasma processing apparatus forms a first film on a second pair of side walls facing each other with a spacing therebetween narrower than that of a first pair of side walls formed on the processing target, in which the first film on the second pair of side walls is thinner than the first film formed on the first pair of side walls. In addition, in the second step, the plasma processing apparatus forms the second film such that the second film formed on the second pair of side walls is thicker than the second film formed on the first pair of side walls. Therefore, the plasma processing apparatus according to the embodiment is capable of performing a dimension control by adjusting the film thickness for each pair of side walls facing each other, in which spacings between side pairs facing each other in respective pairs are different from each other, and thus it is possible to improve a pattern precision.

In the plasma processing method according to the embodiment, in the first step, the plasma processing apparatus forms a first film including a component that becomes a factor of inhibiting the formation of the second film in the film forming cycle. Therefore, the plasma processing apparatus according to the embodiment is capable of precisely controlling the film thickness of the second film to be formed thereafter by the film thickness of the first film.

In the plasma processing method according to the embodiment, the plasma processing apparatus forms a hydrophobic first film in the first step. In addition, the plasma processing apparatus forms a first film containing fluorine (F) in the first step. Further, in the first step, the plasma processing apparatus forms a first film using a gas which does not contain hydrogen and contains fluorocarbon (CF). The plasma processing apparatus according to the embodiment is capable of forming the first film by selecting the material that causes the incubation of the second film, as described above. Therefore, it is possible to precisely control the dimensions of a pattern.

In the plasma processing method according to the embodiment, in the second step, the plasma processing apparatus forms the second film after removing the first film. Therefore, the plasma processing apparatus according to the embodiment is capable of precisely controlling the film thickness of the second film by the film thickness of the first film.

In the plasma processing method according to the embodiment, the plasma processing apparatus repeats the sequence including the first step and the second step once or more times. Therefore, the plasma processing apparatus according to the embodiment is capable of precisely controlling the film thickness of the second film to be formed by adjusting the number of times of repeating the sequence.

In addition, the plasma processing method according to an embodiment includes, after the second step, a third step of etching using the second film as a mask. Therefore, the plasma processing apparatus according to the embodiment is capable of performing the etching after precisely controlling the dimensions of the second film serving as the mask. Therefore, it is possible to precisely control the dimensions of a pattern formed by the etching.

In addition, a pair of side walls of a processing target in the plasma processing method according to the embodiment at least partially includes a curved surface. Therefore, the plasma processing apparatus according to the embodiment is capable of precisely controlling not only the dimensions of a linearly formed pattern, but also the dimensions of a curvilinearly formed pattern.

In the plasma processing method according to the embodiment, in the second step, an atomic layer deposition cycle is performed once or more times to form the second film. Therefore, the plasma processing apparatus according to the embodiment is capable of easily controlling the film thickness of the second film using the self-controllability of atomic layer deposition.

In the first step of the plasma processing method according to the embodiment, the plasma processing apparatus forms the first film through chemical vapor deposition or plasma enhanced chemical vapor deposition. Therefore, the plasma processing apparatus according to the embodiment is capable of efficiently performing the processing.

In the first step of the plasma processing method according to the embodiment, the plasma processing apparatus forms the first film having a thickness difference depending on at least one of an aspect ratio of an opening formed on a processing target, a solid angle, a width and a depth of the opening, an area of the opening, and a compactness and a line and space of a pattern. Therefore, the plasma processing apparatus according to the embodiment is capable of precisely controlling the dimensions of a pattern using the loading effect generated due to various factors.

In addition, the plasma processing method according to the embodiment includes a step of forming a first film on a processing target, and a step of performing a film forming cycle on the processing target. Then, the film forming cycle is performed using a precursor gas which is not chemisorbed to the surface of the first film but chemisorbed to the surface of the processing target, and a reaction gas which generates radicals to form the plasma that remove the first film. Therefore, the plasma processing method according to the embodiment is capable of controlling the film thickness of the film formed in the film forming cycle using the first film. Therefore, the plasma processing method according to the embodiment is capable of precisely controlling the dimensions of a pattern.

In addition, a plasma processing method according to the embodiment includes performing a film forming cycle, including a step of simultaneously performing a processing of removing a first film by a first predetermined amount on a processing target and a processing of depositing a second film by a second predetermined amount different from the first predetermined amount using the same gas. Therefore, the plasma processing method according to the embodiment is capable of performing two different processings of film removal and film formation in a single step. Therefore, the plasma processing method according to the embodiment is capable of efficiently controlling the dimensions of a pattern.

<Modification 1>

In the above-described embodiment, incubation time of a film forming cycle (e.g., an ALD cycle) is controlled based on the film thickness of the first film. Instead of this, for example, the film thickness of the second film may be varied by performing a modification processing by the ALD cycle on the first film while setting the film thickness of the first film to be constant.

For example, in step S63 of FIG. 6, instead of forming the first film having different thicknesses depending on the shape of a pattern on a processing target, the first film having a uniform thickness is formed on the processing target. At this time, as a film forming method, for example, thermal chemical vapor deposition (CVD) and a method of forming a film by causing polymerization reaction by a temperature control by supplying two types of organic gases may be used.

Then, in step S64 of FIG. 6, a modification processing using the loading effect is performed. For example, during the ALD cycle, a silicon-containing gas is supplied to the chamber 21 as a precursor gas in the chemisorption step (see FIG. 2A). Then, in the reaction step (see FIG. 2C), a fluorocarbon ($C_xF_y$ (e.g., $C_4F_6$)) and an O-containing gas are supplied to the chamber 21 as reaction gases. A purge step may be performed to purge the inside of the chamber 21 after each of the chemisorption step and the reaction step.

In this case, the silicon-containing gas is not chemisorbed in the portion where the first film is formed in the chemisorption step, and the first film is removed by the O-containing plasma in the reaction step. In addition, in the reaction step, the fluorocarbon contained in the reaction gas is deposited on the first film. On the other hand, in the chemisorption step, the silicon-containing gas is chemisorbed to the portion where the first film (and the fluorocarbon film deposited on the first film) is removed by the O-containing plasma, and in the reaction step, oxygen radicals and silicon-containing molecules react to form an $SiO_2$ film.

In the reaction step, in the pattern on the processing target, $C_xF_y$ is difficult to enter the dense portion of the pattern, and $C_xF_y$ is likely to enter the coarse portion of the pattern. Therefore, the film formation amount by $C_xF_y$ decreases in the portion in which the pattern is dense (X side), and the film formation amount by $C_xF_y$ increases in the portion in which the pattern is coarse (Y side). In addition, the O-containing plasma is difficult to enter the portion in which the pattern is dense, and the O-containing plasma is likely to enter the portion in which the pattern is coarse. Therefore, the removed amount of the first film removed by the O-containing plasma generated from the O-containing gas is smaller in the portion in which the pattern is dense (X side), and the removed amount of the first film increases in the portion in which the pattern is coarse (Y side). By adjusting the ratio of the fluorocarbon and the O-containing gas contained in the reaction gas such that the removal rate of the first film in the X side is higher than the removal rate of the first film in the Y side, it is possible to obtain the X>Y shrink effect (FIG. 5C). Therefore, it is also possible to implement the X>Y shrink effect (see FIG. 5C) by the plasma processing method according to the modification.

<Modification 2>

In the above-described embodiment, the processing conditions of the ALD cycle are to provide a processing time sufficient for completing self-controllable adsorption and reaction on the surface of a processing target. Without being limited to this, the processing conditions of the ALD cycle may be set not to complete self-controllable adsorption and reaction on the surface of a processing target. For example, so-called unsaturated ALD (hereinafter, also referred to as sub-conformal ALD) may be used in the second step. It is possible to implement the sub-conformal ALD, for example, in the following two aspects.

(1) A precursor is adsorbed onto the entire surface of a processing target. A control is performed such that a reaction gas introduced thereafter does not reach the entire surface of the processing target.

(2) A precursor is adsorbed onto only a portion of the surface of a processing target. The reaction gas introduced thereafter forms a film only on the surface portion where the precursor is adsorbed.

By using sub-conformal ALD, it is possible to form the second film such that the thickness of the second film gradually decreases from the top to the bottom.

Figure 10A:
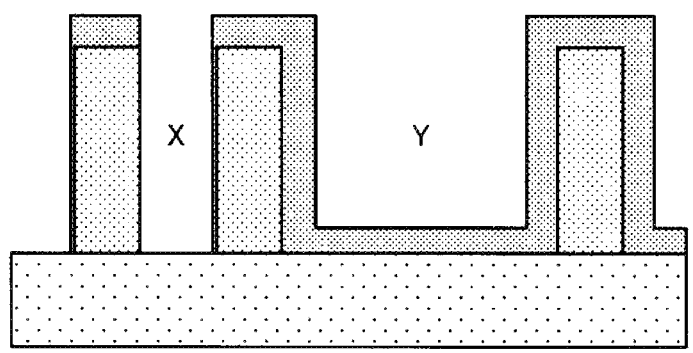
FIG. 10A is a view for explaining a first step of a plasma processing method according to Modification 2.
Figure 10B:
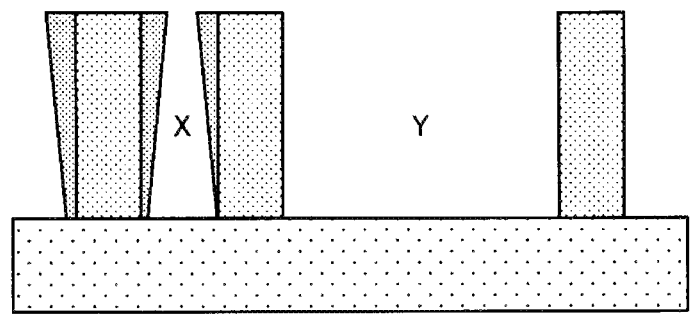
FIG. 10B is a view for explaining a second step of a plasma processing method according to Modification 2.

FIG. 10A is a view for explaining a first step of a plasma processing method according to Modification 2. FIG. 10B is a view for explaining a second step of a plasma processing method according to Modification 2. The X-Y pattern illustrated in FIG. 10A is the same as the X-Y pattern illustrated in FIG. 5B, but the amount of film formation on the short side X is set smaller than that in the example of FIG. 5B.

In the first step of Modification 2, a control is performed to reduce the opening dimension of the long side Y while maintaining the opening dimension of the short side X using CVD (X<Y shrink). Thereafter, in the second step, a control is performed to maintain the opening dimension of the long side Y while reducing the opening dimension of the short side X using sub-conformal ALD (X>Y shrink). At this time, on the short side X, the second film is formed by the unsaturated ALD such that the film thickness gradually decreases from the top to the bottom. In addition, the second film is not formed on the bottom portion of the short side X. Thus, by using the sub-conformal ALD, it is possible to suppress the amount of film formation on the bottom portion of the processing target. Further, in the case of using the sub-conformal ALD, the relationship is maintained in which, as the film thickness of the first film increases, the film thickness of the second film formed in the same portion decreases. Therefore, according to the plasma processing method, it is possible to implement a dimension control of the X-Y pattern.

As in Modification 2, in the plasma processing method of the present embodiment, in the second step, the second film may be formed by performing the sub-conformal ALD cycle once or more times under the processing condition in which self-controllable adsorption or reaction on the surface of the processing target is not completed. Therefore, the plasma processing method is capable of not only controlling the X-Y pattern, but also suppressing the amount of film formation on the bottom portion of the pattern. Thus, it is possible to easily perform the subsequent processing, for example, etching.

According to the present disclosure, it is possible to implement a precise dimension control of a pattern formed on a substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
a plasma processing chamber;
a gas supply configured to supply a processing gas to the plasma processing chamber;
a power supply configured to supply power to the plasma processing chamber to generate plasma in the plasma processing chamber; and
a controller,
wherein the controller is configured to cause:
(a) forming a first film on side walls of an opening of a processing target using the plasma so that the first film has different thicknesses along a spacing between pairs of side walls facing each other; and
(b) forming a second film by performing a film forming cycle one or more times after (a) so that the second film has different thicknesses along the spacing between the pairs of side walls facing each other,
wherein, in (a), the first film is formed such that the first film formed on a second pair of side walls, which are facing each other with a spacing narrower than that of a first pair of side walls formed on the processing target, is thinner than the first film formed on the first pair of side walls, and
in (b), the second film is formed such that the second film formed on the second pair of side walls is thicker than the second film formed on the first pair of side walls.

2. The plasma processing apparatus according to claim 1, wherein, the controller is further configured such that, in (a), the first film contains a component that serves as a factor of inhibiting formation of the second film in the film forming cycle.

3. The plasma processing apparatus according to claim 2, wherein the controller is further configured such that, in (a), the first film is a hydrophobic film.

4. The plasma processing apparatus according to claim 3, wherein the controller is further configured such that, in (a), the first film contains fluorine (F).

5. The plasma processing apparatus according to claim 4, wherein the controller is further configured such that, in (a), the first film is formed by a gas that contains fluorocarbon (CF) without hydrogen.

6. The plasma processing apparatus according to claim 1, wherein the controller is further configured such that, in (b), the second film is formed after the first film is removed.

7. The plasma processing apparatus according to claim 1, wherein the controller is further configured to repeat a sequence including (a) and (b) once or more times.

8. The plasma processing apparatus according to claim 1, wherein at least a portion of the pairs of side walls includes a curved surface.

9. The plasma processing apparatus according to claim 1, wherein the controller is further configured such that, in (b), the second film is formed by performing the film forming cycle including supplying a first gas including a precursor to the processing target and supplying a second gas including a reaction gas that reacts with eh precursor to the processing target one or more times.

10. The plasma processing apparatus according to claim 1, wherein the controller is further configured such that, in (b), the second film is formed by performing the film forming cycle including adsorbing a precursor of a first gas onto an entire surface of the processing target and controlling a second gas including a reaction gas that reacts with the precursor such that the reaction gas reaches a portion of the surface of the processing target one or more times under a processing condition in which self-controllable adsorption or reaction on a surface of the processing target is not completed.

11. The plasma processing apparatus according to claim 1, wherein the controller is further configured such that, in (a), the first film is formed through chemical vapor deposition or plasma enhanced chemical vapor deposition.

12. The plasma processing apparatus according to claim 1, wherein the controller is further configured such that, in (a), the first film is formed to have a thickness difference depending on at least one of an aspect ratio of an opening formed in the processing target, a solid angle, a width and a depth of the opening, an area of the opening, and a compactness and a line and space of a pattern.

13. The plasma processing apparatus according to claim 1, wherein the processing target includes a substrate having a plurality of openings, each opening being formed by the second pair of side walls along a second direction and the first pair of side walls along a first direction orthogonal to the second direction.

14. The plasma processing apparatus according to claim 1, wherein the controller is further configured such that, in (b), the second film is formed by performing the film forming cycle including adsorbing a precursor of a first gas onto a portion of a surface of the processing target and supplying a second gas including a reaction gas that reacts with the precursor to the processing target one or more times under a processing condition in which self-controllable adsorption or reaction on a surface of the processing target is not completed.

15. A plasma processing apparatus comprising:
a plasma processing chamber;
a gas supply configured to supply a processing gas to the plasma processing chamber;
a power supply configured to supply power to the plasma processing chamber to generate plasma in the plasma processing chamber; and
a controller,
wherein the controller is configured to cause:
(a) forming a first film on side walls of an opening of a processing target using the plasma so that the first film has different thicknesses along a spacing between pairs of side walls facing each other;
(b) forming a second film by performing a film forming cycle one or more times after (a) so that the second film has different thicknesses along the spacing between the pairs of side walls facing each other; and
performing etching using the second film as a mask, after (b).

16. The plasma processing apparatus according to claim 15, wherein the controller is further configured such that, in (b), the first film is gradually removed as the film forming cycle is repeated.

17. A plasma processing apparatus comprising:
a plasma processing chamber;
a gas supply configured to supply a processing gas to the plasma processing chamber;

a power supply configured to supply power to the plasma processing chamber to generate plasma in the plasma processing chamber; and a controller, wherein the controller is configured to cause:
- (a) forming a first film on side walls of an opening of a processing target using the plasma so that the first film has different thicknesses along a spacing between pairs of side walls facing each other; and
- (b) forming a second film by performing a film forming cycle one or more times after (a) so that the second film has different thicknesses along the spacing between the pairs of side walls facing each other, wherein, in (a), the first film is formed such that the first film formed on a second pair of side walls, which are facing each other with a spacing narrower than that of a first pair of side walls formed on the processing target, is thinner than the first film formed on the first pair of side walls, and in (b), a second shrinkage of a second opening formed between the second pair of side walls is greater than a first shrinkage of a first opening formed between the first pair of side walls.

* * * * *